United States Patent
Yang

(10) Patent No.: US 7,186,633 B2
(45) Date of Patent: Mar. 6, 2007

(54) METHOD AND STRUCTURE FOR TUNGSTEN GATE METAL SURFACE TREATMENT WHILE PREVENTING OXIDATION

(75) Inventor: Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 10/862,990

(22) Filed: Jun. 8, 2004

(65) Prior Publication Data

US 2004/0229451 A1 Nov. 18, 2004

Related U.S. Application Data

(62) Division of application No. 10/261,218, filed on Sep. 30, 2002, now abandoned.

(51) Int. Cl.
*H01L 21/3205* (2006.01)
(52) U.S. Cl. ............... 438/596; 438/592; 438/E21.177
(58) Field of Classification Search ........ 438/570–583, 438/584, 585, 592–596, 652–657, 769
See application file for complete search history.

(56) References Cited

U.S. PATENT DOCUMENTS

| | | | |
|---|---|---|---|
| 4,958,321 A | 9/1990 | Chang | |
| 5,308,783 A | 5/1994 | Krautschneider et al. | |
| 5,739,066 A | 4/1998 | Pan | |
| 6,284,634 B1 * | 9/2001 | Rha | 438/592 |
| 6,284,636 B1 | 9/2001 | Hossain et al. | |
| 6,372,618 B2 * | 4/2002 | Forbes et al. | 438/596 |
| 6,417,537 B1 * | 7/2002 | Yang et al. | 257/310 |

\* cited by examiner

*Primary Examiner*—Marcos D. Pizarro-Crespo
(74) *Attorney, Agent, or Firm*—Yuanmin Cai

(57) ABSTRACT

As disclosed herein, an FEOL line conductor stack is formed including a base conductor layer, an overlying layer of tungsten, and an optional gate capping layer. The stack, including layers from the optional capping layer down to the base conductor layer are directionally etched until an underlying layer is exposed. Then, the substrate is exposed to one or the other or both of: 1) a silicon-containing ambient to form a self-aligned layer of tungsten silicide on sidewalls of the tungsten layer; and 2) a source of nitrogen to form a thin layer of tungsten nitride on sidewalls of the tungsten layer. Such tungsten silicide and/or tungsten nitride layers serves to protect the tungsten during subsequent processing, among which may include sidewall oxidation (e.g. for a polysilicon base conductor layer) and/or the forming of silicon nitride spacers on sidewalls of the gate stack.

4 Claims, 1 Drawing Sheet

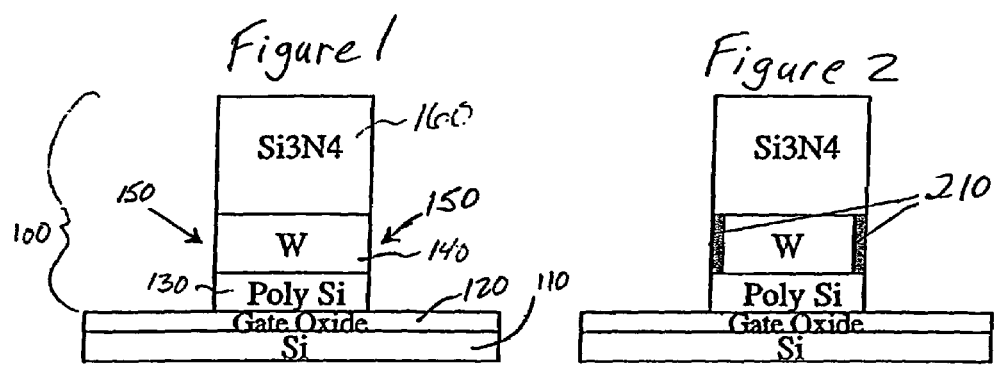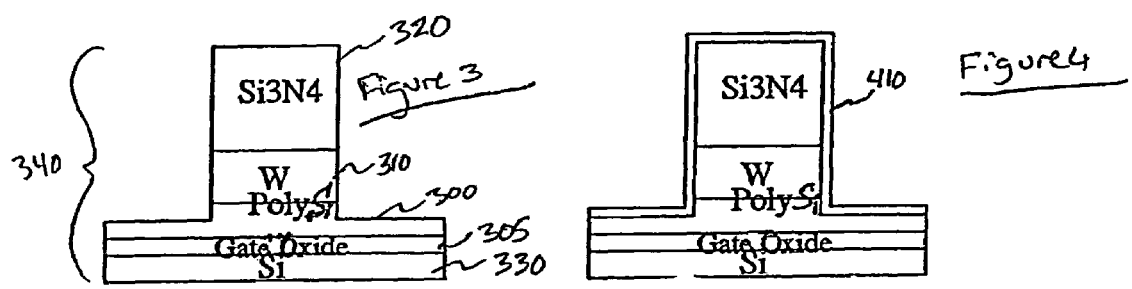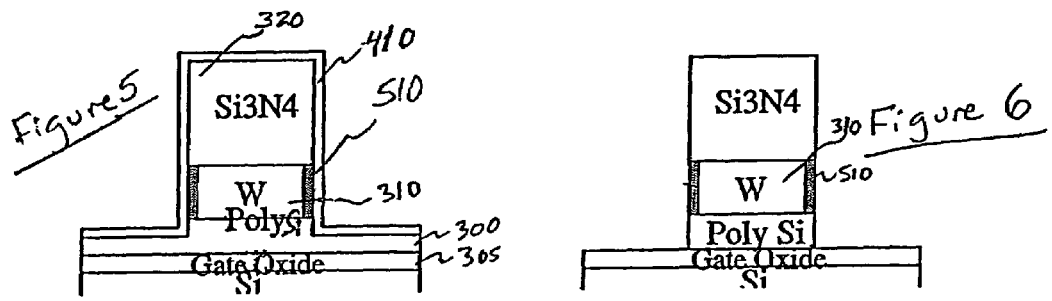

METHOD AND STRUCTURE FOR TUNGSTEN GATE METAL SURFACE TREATMENT WHILE PREVENTING OXIDATION

This application is a division of application Ser. No. 10/261,218, filed Sep. 30, 2002, now abandoned.

FIELD OF THE INVENTION

This invention relates to semiconductor devices and more particularly, to the treatment of the surface of tungsten metal gate conductors to reduce or prevent oxidation.

BACKGROUND OF THE INVENTION

Since the advent of vertical transistors in trench-type dynamic random access memories (DRAMs), those skilled in the art will recognize that the actual gates of such devices are formed by a polysilicon plug inside an upper portion of a trench, the lower portion containing a storage capacitor. However, the wordlines which access the vertical transistor gates extend in linear paths above the substrate, and have a similar structure and extent to actual gate conductors, which contact the gate oxide of planar transistors. Such wordlines, and actual gate conductors are formed as line structures in a front-end-of-line (FEOL) process. Both types often have a stacked structure, including a lower layer of polysilicon, and an overlying low resistance layer, often including a metal silicide, over which a capping layer may optionally be formed. While they can both be referred to as FEOL conductive line stacks, in the description which follows, the terms "gate" and "gate conductor" are intended to refer to either type of structure, whether the "gate conductor" actually and directly contacts a gate oxide of a transistor, or whether it merely acts as an FEOL line conductor, for example as a wordline for accessing a vertical transistor of a trench DRAM, or for some other purpose as an FEOL conductor.

In the manufacture of integrated circuits, including DRAMs, the manufacturing of gate conductors has become more and more important. Particularly, in dynamic random access memories (DRAMs), gate conductors must be manufactured at very tight pitches, requiring gate height to be limited to allow effective insulative gapfill between adjacent gate conductors. On the other hand, the lengths and narrowness required of gate conductors demands that resistance along the gate conductor be kept within a tolerable limit.

The use of tungsten (W) as the gate conductor material is receiving much interest today. While polysilicon, tungsten silicide and/or a combination of the two have been popular as gate conductor materials up to now, smaller groundrules and faster speeds required in new generations demand a lower resistance gate conductor. A low resistance gate conductor material is needed for both speed and to keep the height of the gate stack low enough to permit gaps between them to be filled with an insulator. Accordingly, there is great interest today in using tungsten instead of tungsten suicide as the gate conductor.

However, the use of tungsten creates a new set of challenges. For one, in a gate stack of polysilicon and tungsten, tungsten tends to be oxidized during the selective oxidation of the polysilicon gate sidewall and/or during the deposition of gate silicon nitride spacers. Sidewall oxidation of the polysilicon is necessary to heal damage from the gate stack etch, and to round gate polysilicon corners, which could otherwise give rise to corner conduction and gate oxide breakdown. However, the poly sidewall oxidation can seriously deteriorate the tungsten. Tungsten is unlike some other metals in that when it Is oxidized, a spike-like $WO_x$ "grass" is formed which "grows" out in many directions, and which may even extend far into the material. Once the tungsten oxide extends internally in such manner, efforts to remove the oxide from the material are ineffective. Consequently, a need exists for engineering the tungsten surface to prevent or reduce oxidation of tungsten when performing the gate polysilicon sidewall oxidation.

Apart from the poly sidewall oxidation, other process steps also tend to form tungsten oxides during gate stack processing, including gate sidewall spacer formation, and even oxidation just by moving the substrate from one process tool to another, because of oxygen being present in the ambient. Hence, a tightly controlled process would have to be used to remove oxygen from the ambient, such as maintaining a vacuum In the chamber, and/or pumping $N_2$ into the chamber, and doing the same for airlock and "loadlock" chambers between successive process chambers.

SUMMARY OF THE INVENTION

A gate stack is formed including a lower base conductor layer, an overlying layer of tungsten, and an optional gate capping layer, preferably of silicon nitride. According to an embodiment of the invention, the gate stack, including layers from the optional capping layer down to the base conductor layer are directionally etched until an underlying layer is exposed. Then, the substrate is exposed to one or the other or both of: 1) a silicon-containing ambient to form a self-aligned layer of tungsten suicide on sidewalls of the tungsten layer, and 2) a source of nitrogen to form a thin layer of tungsten nitride on sidewalls of the tungsten layer. Thereafter, usual processes are resumed, among which may be a gate poly sidewall oxidation and/or the forming of silicon nitride spacers on sidewalls of the gate stack.

In another embodiment, the gate stack is only partially etched, from the capping layer down through the tungsten layer until at least the base conductor layer is exposed, but not completely etched. Then, a thin layer of silicon is deposited and then annealed to form tungsten suicide on the exposed tungsten sidewalls. Thereafter, the base conductor layer etch is completed, and then any necessary sidewall oxidation (e.g. for polysilicon gate sidewalls) is performed.

BRIEF DESCRIPTION OF THE DRAWINGS

FIGS. 1 and 2 illustrate a first embodiment in which a protective silicidation and/or nitridation is applied to sidewalls of a tungsten gate.

FIGS. 3 through 6 illustrate a second embodiment in which a self-aligned silicide is formed on sidewalls of a tungsten gate prior to etching an underlying base conductor layer of a gate stack.

DETAILED DESCRIPTION OF THE PREFERRED EMBODIMENTS

FIG. 1 illustrates a first embodiment. As shown in FIG. 1, an 10 exemplary gate stack 100 has been formed and etched, having the following layers: a gate cap layer of silicon nitride (160) overlying a tungsten layer (140), which, in turn, overlies a base conductor layer (130), overlying a substrate 110. In the Illustrated embodiment, base conductor layer 130 preferably comprises polysilicon, and a gate oxide 120 Is shown between the semiconductor substrate 110 and the polysilicon 130. However, those skilled in the art will understand that the gate oxide 120 need not be present, and the semiconductor substrate need not be in close proximity to the polysilicon 130, as the term "gate stack" includes the structure of an FEOL conductive line stack, such as may be used as a wordline In a vertical transistor trench DRAM. Thus, the gate stack may be an FEOL conductive line stack including a tungsten layer 140 formed over a base conductor layer 130, the base conductor layer comprising one or more conductor layers, e.g. of metals, metal nitrides, metal silicides, or other conductors. Moreover, the FEOL conductive line stack may be placed in contact with either the semiconductor substrate, a gate dielectric, or even a thick dielectric, e.g. an interlevel dielectric, such as for use as a tungsten bitline of a DRAM array formed over a lowest level interlevel dielectric.

Prior to later processes, such as performing sidewall oxidation of the gate polysilicon 130, the gate stack 100 is exposed to a silicon-containing ambient such as mono-silane ($SiH_4$), di-silane ($Si_2H_2$), dichlor-silane ($SiCl_2H_2$), or other Si containing ambient to deposit silicon onto sidewalls 150 of the tungsten layer 140. As shown in FIG. 2, during either a separate anneal without oxygen present, or during subsequent hot processing, during which a poly sidewall oxidation may be done, a thin layer of $WSi_x$ is formed from the deposited silicon on the sidewalls of the tungsten, thereby protecting the tungsten from oxidation.

Still referring to FIGS. 1 and 2, as an alternative, or in conjunction with forming tungsten silicide on the tungsten sidewalls 150, a protective tungsten nitride layer 210 is formed on the sidewalls 150. Nitridation may be performed by one or more of the following, among others: directing UV light onto $N_2$ gas above the substrate to dissociate $N_2$ to N+, the N+ ions then reacting with the tungsten, by forming a tungsten nitride and/or oxynitride layer which prevents farther oxidation, such as by using ammonia ($NH_3$), nitric oxide (NO), nitrous oxide ($N_2O$) or similar substances; and/or annealing the gate stack in $NH_3$ or other nitrogen containing ambient to form a thin layer of $WN_x$ layer on the sidewalls of the tungsten metal. When tungsten oxynitride is formed ($WO_xN_y$), the ration x:y of oxygen to nitrogen in the oxynitride layer should preferably be between 0.1 and 10. Tungsten nitride is less readily oxidized than tungsten. When $WN_x$ is oxidized, at most a smooth layer of $WO_x$ is formed, instead of the aforementioned spike-like $WO_x$ "grass", which forms on tungsten metal.

Another embodiment of the invention is illustrated with respect to FIGS. 3 through 6. In this embodiment, on substrate 330, the gate stack 340, including an optional gate cap layer 320 (preferably of silicon nitride), tungsten layer 310, and base conductor layer (again preferably polysilicon) 300, are etched through tungsten layer 310, stopping when the base conductor layer 300 is exposed, as shown in FIG. 3. The gate stack preferably includes a gate oxide 305 between the base conductor layer 300 and the substrate 330. Endpoint detection can be used, but a timed etch is also adequate. A thin layer of silicon 410 is then deposited, as shown in FIG. 4, for example by exposing the substrate 330 to a silicon-containing ambient such as mono-silane ($SiH_4$), di-silane ($Si_2H_2$), dichlor-silane ($SiCl_2H_2$) or other Si containing ambient.

Then, as Illustrated in FIG. 5, the substrate 330 is annealed such that the deposited silicon 410 reacts with the tungsten 310 to form a thin self-aligned layer of tungsten silicide 510 on the sidewalls of the tungsten layer 310. Thereafter, the gate stack etch is continued through the base conductor layer 320, stopping when the gate oxide layer 305 is exposed, as shown in FIG. 6. As a result of this silicon etch, the remaining thin silicon layer 410 is removed from sidewalls of the gate capping layer 320 and the base conductor layer 300. In such manner a self-aligned thin tungsten silicide layer 510 has been formed on sidewalls of the tungsten layer, as protection for the subsequent process steps, among which may include a polysilicon sidewall oxidation.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. In an integrated circuit, a method of fabricating tungsten gate conductors, comprising the steps of:
   providing a gate stack including a polysilicon layer over a gate dielectric on a substrate, a tungsten layer over said polysilicon layer, and a capping layer over said tungsten layer;
   etching said gate stack down to said gate dielectric;
   exposing said gate stack to an ambient containing nitrogen and oxygen;
   forming an oxynitride layer on exposed sidewalls of said tungsten layer; and
   thereafter exposing said gate stack to oxygen to form an oxide on sidewalls of said polysilicon layer.

2. The method of claim 1, wherein said capping layer is comprised of silicon nitride.

3. The method of claim 1, wherein the oxynitride layer is formed selectively on the sidewalls of the tungsten layer and prevents oxidation of said tungsten layer during formation of the oxide on the sidewalls of the polysilicon layer.

4. The method of claim 1, wherein said tungsten oxynitride is characterized as $WO_xN_y$, the oxygen and nitrogen therein having a ratio x:y in the range of 0.1 to 1.0.

* * * * *